(12) United States Patent
Mahler et al.

(10) Patent No.: US 10,297,564 B2
(45) Date of Patent: May 21, 2019

(54) SEMICONDUCTOR DIE ATTACH SYSTEM AND METHOD

(71) Applicant: Infineon Technologies AG, Neubiberg (DE)

(72) Inventors: Joachim Mahler, Regensburg (DE); Georg Meyer-Berg, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/725,796

(22) Filed: Oct. 5, 2017

(65) Prior Publication Data

US 2019/0109112 A1    Apr. 11, 2019

(51) Int. Cl.

| | |
|---|---|
| C09J 5/06 | (2006.01) |
| H01L 21/56 | (2006.01) |
| H01L 23/00 | (2006.01) |
| H01L 23/31 | (2006.01) |
| C09J 163/00 | (2006.01) |
| C09J 177/04 | (2006.01) |

(Continued)

(52) U.S. Cl.
CPC ............... *H01L 24/29* (2013.01); *C09J 5/06* (2013.01); *H01L 21/565* (2013.01); *H01L 23/3114* (2013.01); *H01L 24/73* (2013.01); *H01L 24/83* (2013.01); *C09J 163/00* (2013.01); *C09J 177/04* (2013.01); *C09J 179/02* (2013.01); *C09J 181/00* (2013.01); *C09J 183/04* (2013.01); *C09J 2203/10* (2013.01); *C09J 2463/00* (2013.01); *C09J 2477/00* (2013.01); *C09J 2479/00* (2013.01); *C09J 2481/00* (2013.01); *C09J 2483/00* (2013.01); *H01L 2224/2919* (2013.01); *H01L 2224/29339* (2013.01); *H01L 2224/29347* (2013.01); *H01L 2224/29388* (2013.01); *H01L 2224/73265* (2013.01); *H01L 2224/83851* (2013.01)

(58) Field of Classification Search
CPC ..... H01L 2224/2919; H01L 2224/2969; H01L 2224/2999; H01L 2224/29686; H01L 2224/29986; C09J 5/06; C09J 163/00
See application file for complete search history.

(56) References Cited

U.S. PATENT DOCUMENTS

| | | | |
|---|---|---|---|
| 2007/0137887 A1* | 6/2007 | Watanabe | C09J 9/02 174/256 |
| 2012/0024469 A1* | 2/2012 | Takamoto | H01L 21/561 156/249 |

(Continued)

OTHER PUBLICATIONS

"LORD MT-815", USA Safety Data Sheet, LORD Corporation, Effective Date: Jul. 14, 2015.

*Primary Examiner* — David A Zarneke
(74) *Attorney, Agent, or Firm* — Murphy, Bilak & Homiller, PLLC (57) ABSTRACT

A semiconductor package includes a semiconductor die, a substrate for supporting the semiconductor die, an encapsulant covering the semiconductor die and at least part of the substrate, and a die attach material attaching the semiconductor die to the substrate. The die attach material includes molecules having a first functional group with at least one free electron pair and a second functional group chemically reacted or reactable with the encapsulant in a way that promotes adhesion with the encapsulant. A corresponding method of manufacturing the semiconductor package is also described.

25 Claims, 6 Drawing Sheets

(51) Int. Cl.
*C09J 179/02* (2006.01)
*C09J 181/00* (2006.01)
*C09J 183/04* (2006.01)

(56) References Cited

U.S. PATENT DOCUMENTS

| | | | |
|---|---|---|---|
| 2014/0179065 A1* | 6/2014 | Lee | H01L 24/83 438/119 |
| 2015/0364317 A1* | 12/2015 | Tanino | H01J 61/26 313/492 |
| 2016/0009947 A1* | 1/2016 | Sugiyama | H01L 24/29 257/783 |
| 2016/0069297 A1* | 3/2016 | Sawyers-Abbott | F02K 1/72 415/69 |
| 2016/0322308 A1* | 11/2016 | Takamoto | H01L 23/544 |
| 2016/0351432 A1* | 12/2016 | Takamoto | H01L 21/6836 |
| 2017/0005062 A1* | 1/2017 | Azuma | C09J 7/38 |
| 2017/0012022 A1* | 1/2017 | Yoshida | G03F 7/027 |
| 2017/0200629 A1* | 7/2017 | Tsukui | C08F 220/18 |

* cited by examiner

SEMICONDUCTOR DIE ATTACH SYSTEM AND METHOD

TECHNICAL FIELD

The present application relates to semiconductor dies, in particular systems and methods for attaching semiconductor dies to a substrate.

BACKGROUND

Semiconductor dies are often attached to a substrate such as a leadframe, printed circuit board (PCB), etc. using a die attach paste such as an adhesive paste, a solder paste or a sinter paste. With thinner semiconductor dies, creepage of the die attach paste onto the top side of the die becomes more likely, which can result in electrical failure. In addition to avoiding such creepage, acceptable wetting between the back side of the die and the substrate also is important. Wetting refers to the flow of die attach material along x and y horizontal directions of the substrate. The better the wetting, the more easy the die attach process and the higher the probability to achieve a high-reliability level of the die attach during stress testing. Strong adhesion with an encapsulation material such as mold compound that surrounds the semiconductor die is yet another important consideration, especially at the top side of the die and at the inner leads before and after reliability stress testing.

Standard die attach processes which use conventional adhesive pastes, solder pastes and sinter pastes must be carefully controlled to avoid creepage of the die attach material onto the top side of the die during the die attach process, especially for thin dies. Standard die attach films can be used instead of pastes, where creepage is not an issue. However, die attach films are more expensive and have lower thermal and electrical performance as compared to adhesive pastes, solder pastes and sinter pastes. Further, another issue is to avoid voids.

Hence, there is a need for a low-cost die attach system with good wettability to the substrate and good adhesion with the die encapsulation material.

SUMMARY

According to an embodiment of a semiconductor package, the semiconductor package comprises a semiconductor die, a substrate for supporting the semiconductor die, an encapsulant covering the semiconductor die and at least part of the substrate, and a die attach material attaching the semiconductor die to the substrate. The die attach material comprises molecules having a first functional group with at least one free electron pair and a second functional group chemically reacted or reactable with the encapsulant in a way that promotes adhesion with the encapsulant.

According to an embodiment of a method of manufacturing a semiconductor package, the method comprises: applying a die attach material to a substrate, the die attach material comprising molecules having a first functional group with at least one free electron pair and a second functional group; placing a semiconductor die on the die attach material; covering the semiconductor die and at least part of the substrate with an encapsulating material; and processing the substrate with the semiconductor die and the encapsulating material at an elevated temperature, to cure the encapsulating material, solidify the die attach material and chemically react the second functional group of at least some of the molecules with a precursor of the encapsulating material in a way that promotes adhesion with the encapsulating material as the encapsulating material cures.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a semiconductor die attach system which avoids creepage of the die attach material onto the top side of the semiconductor die, has good wettability between the back side of the die and the substrate, and has increased adhesion with an encapsulation material that covers the semiconductor die.

Figure 1:
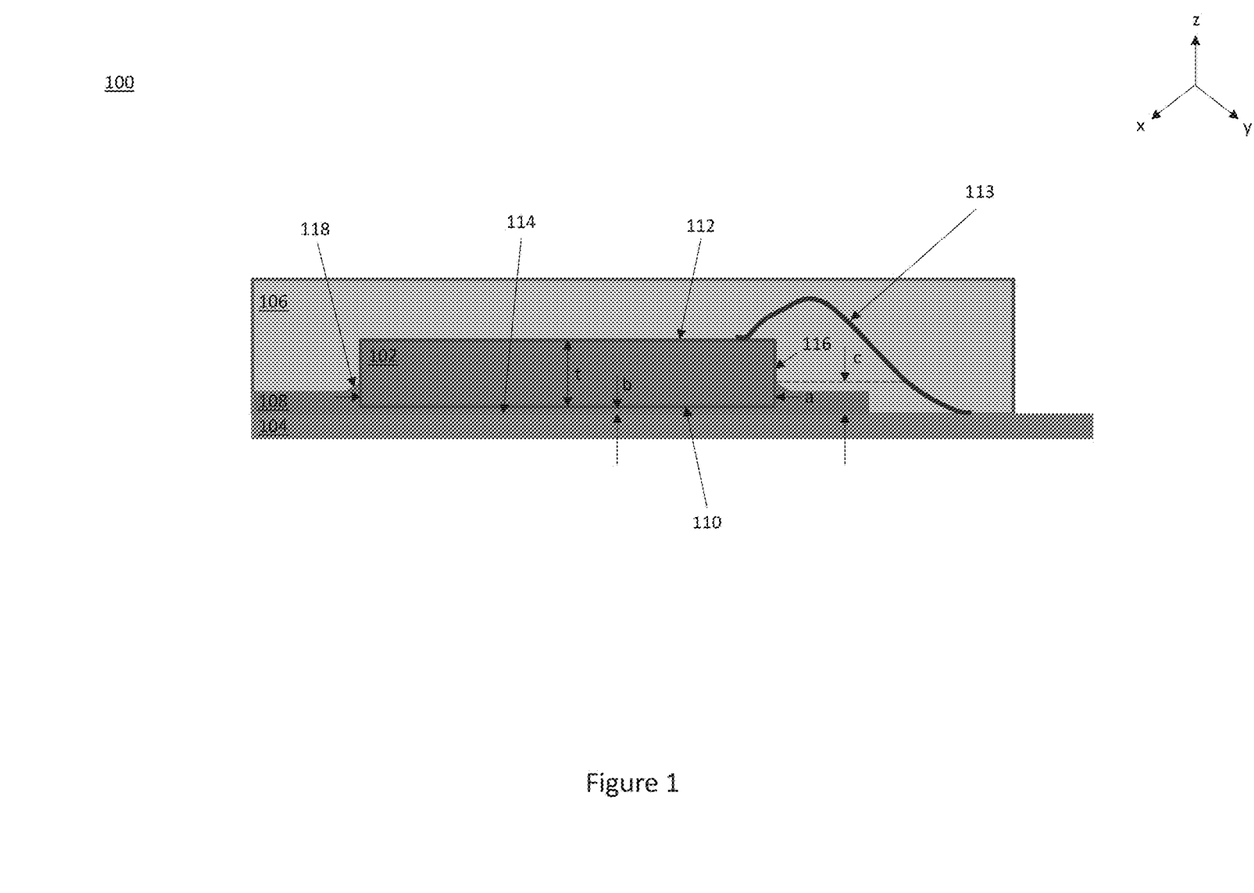
FIG. 1 illustrates a partial sectional view of an embodiment of a semiconductor package with a multi-functional die attach material.

FIG. 1 illustrates a partial sectional view of a semiconductor package 100. The semiconductor package 100 can be a leadless or leaded package. Leaded packages have legs or leads around the perimeter of the package, which can either go through a PCB or other type of substrate and are soldered on the substrate backside (through-hole) or directly to the substrate front side (surface mount). Leadless packages save space by keeping the contact points underneath the package instead of at the perimeter. In either case, the semiconductor package 100 can have any standard configuration such as, but not limited to, through-hole, surface mount, chip carrier, pin grid array, ball grid array, multi-chip package, etc.

The semiconductor package 100 includes a semiconductor die 102, a substrate 104 for supporting the semiconductor die 102, an encapsulant 106 covering the semiconductor die 102 and at least part of the substrate 104, and a die attach material 108 attaching the semiconductor die 102 to the substrate 104. One semiconductor die 102 is shown in FIG. 1 for ease of illustration.

Figure 2:
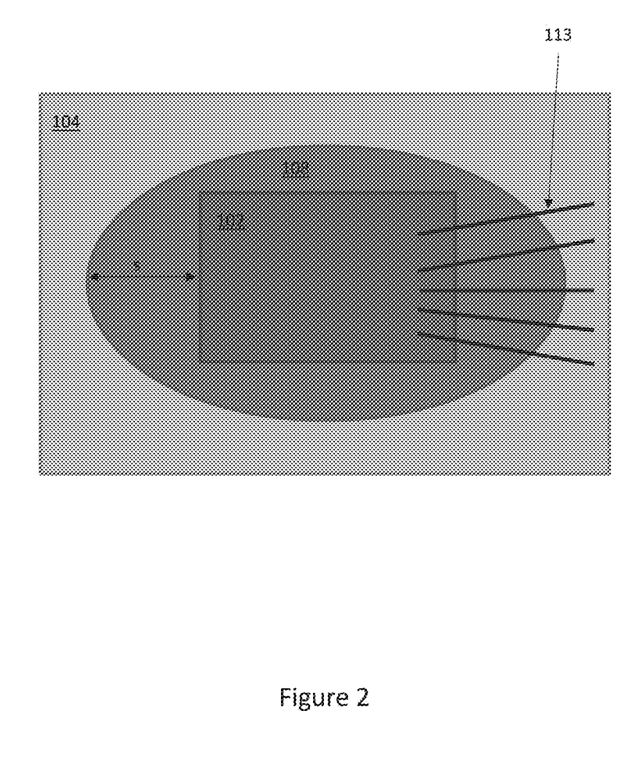
FIG. 2 illustrates a top-down plan of the semiconductor package shown in FIG. 1.

FIG. 2 shows a top-down plan view of the semiconductor package without the encapsulant 106, so that the semiconductor die 102, substrate 104 and die attach material 108 are visible in the top-down plan view.

The die attach material 108 may include electrically conductive fillers such as Ag, Cu, etc. for electrically coupling an electrode at the back side 110 of the semiconductor die 102, such as a drain or collector electrode of a transistor or an anode or cathode electrode of a diode, to an electrically conductive part of the substrate 104. For example, the die 102 can have a ground electrode at the back side 110 electrically connected to a corresponding ground trace of the substrate 104. In addition or alternatively, the die attach material 108 may include thermally conductive fillers such as silica, alumina, boron nitride, etc. for thermally coupling the back side 110 of the semiconductor die 102 to the substrate 104. In yet another embodiment, the die attach material 108 may be devoid of electrically and thermally conductive fillers. Electrical connections 113 between the substrate 104 and one or more electrodes at the top side 112 of the semiconductor die 102 can be provided by, e.g. bond wires, metal clips, metal ribbons, etc.

In general, the semiconductor package 100 can include one or more semiconductor dies 102 attached to the substrate 104. Any type of semiconductor die can be used such as, but not limited to, logic dies, power transistor dies, power diode dies, memory dies, sensor dies, passive semiconductor dies such as capacitor and/or inductor dies, etc. The semiconductor die 102 can be made from any type of semiconductor material such as, but not limited to, single element semiconductors (e.g. Si, Ge, etc.), silicon-on-insulator semiconductors, binary semiconductors (e.g. SiC, GaN, GaAs, etc.), ternary semiconductors, etc. with or without epitaxial layer(s). The semiconductor die 102 can be a lateral die in that the main current path of the device is lateral near the top side 112 of the die 102. For devices with no vertical current flow, metallization on the back side 110 of the semiconductor die 102 can be omitted. The semiconductor die 102 instead can be a vertical die in that the main current path is vertical between the bottom and top sides 110, 112 of the die 102. The semiconductor die 102 can include a single device, such as a single power transistor or diode, or can include more than one device. For example, power and logic devices can be integrated in the semiconductor die 102. Still other die types, configurations and semiconductor material systems are contemplated.

Regardless of the type of semiconductor die 102, the die 102 can have a standard thickness 't' e.g. 700 micrometers thick, 800 micrometers thick, or even thicker. The semiconductor die 102 instead can be relatively thin, e.g. having a thickness 't' less than 500 micrometers. In some cases, the semiconductor die 102 is ultra-thin, e.g. having a thickness 't' in a range of 50 micrometers to 100 micrometers, e.g. 20 micrometers to 300 micrometers, e.g., 50 micrometers to 150 micrometers. In each case, the die attach material 108 does not extend onto the top side 112 of the semiconductor die 102 i.e. the surface facing away from the substrate 104.

The substrate 104 supports the semiconductor die 102. Any standard type of substrate can be used such as, but not limited to, a metal leadframe, printed circuit board (PCB), a flexible substrate, a ceramic with metallized surfaces such as a DBC (direct copper bonded) substrate, AMB (active metal brazed) substrate, IMS (insulated metal substrate), or other types of substrates for supporting semiconductor dies.

Regardless of the type of substrate, the die attach material 108 attaches the semiconductor die 102 to the substrate 104. The die attach material 108 comprises organic molecules having a first functional group with at least one free electron pair and a second functional group chemically reacted or reactable (i.e. capable of chemically reacting) with the encapsulant 106 in a way that promotes adhesion with the encapsulant 106. Because the die attach material 108 has some non-negligible thickness, not every molecule of the die attach material 108 chemically reacts with the encapsulant 106 during the manufacturing process. Hence, the second functional group of some of the molecules remain reactable with the encapsulant 106 after the manufacturing process and therefore would promote adhesion with the encapsulant 106 if reacted with the encapsulant 106. Any standard semiconductor die encapsulant can be used such as, but not limited to, mold compounds formed from an epoxy, laminate films, silicone glob tops, etc.

The bottom side 110 of the semiconductor die 102 has a metal/metal alloy or metal oxide surface. High reactivity/affinity between the metal/metal-alloy or metal-oxide bottom side 110 of the semiconductor die 102 and the die attach surface 114 of the substrate 104, which typically comprises metal or a metal alloy, is realized by ensuring that the first functional group of the molecules of the die attach material 108 has at least one free electron pair. For example, the die attach surface 114 can be a die pad in the case of the substrate 104 being a leadframe. In another example, the die attach surface 114 can be a die pad patterned into a metallized surface of a ceramic in the case of the substrate 104 being a ceramic-based package. In yet another example, the die attach surface 114 can be a metal trace patterned into a metal sheet in the case of the substrate 104 being a PCB. In each case and others, free electron functionalities are separated by interaction with the metal/metal-alloy die attach surface 114 of the substrate 104. As a result, good reaction with a metallized die attach surface 114 of the substrate 104 occurs by electron exchange, providing good wetting and adhesion to the metallized die attach surface 114. With such high reactivity/affinity between the bottom side 110 of the semiconductor die 102 and the die attach surface 114 of the substrate 102, the die attach material 108 has good wetting to the substrate 104 i.e. spreads well in both x and y horizontal directions, but spreads less in the z vertical direction along the edge 116 of the semiconductor die 102. For example, the die attach material 108 may have a fillet 118 which creeps up the edge 116 of the semiconductor die 102 and has a creepage height 'c' preferably <50% of the die thickness 't'.

The thickness 'b' of the die attach material 108 under the semiconductor die 102 typically is not uniform. Also, the creepage height 'c' is typically higher at the middle of the die edge 116 as compared to the die corner, and thus is a function of the distance from the die corner. The creepage height 'c' depends on the thickness 'b' of the die attach material 108 under the semiconductor die 102 and the die width 'a'. According to an embodiment, the overall creepage height 'c' is given by $c(x, b, a) < t$, for $0 <= x <= a/2$. The following are exemplary value ranges for the creepage height 'c' and the parameters that affect the creepage height 'c':

a=0.5-10 mm;
A (total die area)=0.25-100 mm$^2$, e.g. 1-25 mm$^2$;
t=20-450 μm, e.g. 50-300 μm;
b=5-80 μm, e.g. 10-40 μm;
c=5-90%·t, e.g. 10-50%·t.

The fillet 118 in conjunction with the horizontal spreading 's' e.g. 50-1000 μm caused by the first functional group of the die attach material molecules results in good adhesion to the substrate 104, and the second functional group of the die attach material molecules results in good adhesion to the encapsulant 106.

In one embodiment, the first functional group of the die attach material molecules is an amino acid group. In another embodiment, the first functional group of the die attach material molecules is an amine group. In yet another embodiment, the first functional group of the die attach material molecules is a silane group. In still another embodiment, the first functional group of the die attach material molecules is a sulfur group.

The second functional group of the organic molecules of the die attach material 108 is selected so as to be chemically reactive with the encapsulant 106 during the manufacturing process, to increase adhesion between the die attach material 108 and the encapsulant 106 as the base material system for the encapsulant 106 goes through a curing process. For example, the second functional group of at least some of the molecules of the die attach material 108 chemically react with a precursor such as a hardener like unreacted epoxy functional groups of an epoxy-based encapsulating material, in a way that promotes adhesion with the encapsulating material as the encapsulating material cures to form the encapsulant 106. In one embodiment, the second functional group of the molecules of the die attach material 108 is an epoxy group. In another embodiment, the second functional group is a glycidyl ether group.

A die attach material having organic molecules with the first and second functional groups described above avoids creepage of the die attach material 108 onto the top side 112 of the semiconductor die 102, has good wettability between the back side 110 of the die 102 and the substrate 104, and has increased adhesion with the encapsulant 106 that covers the semiconductor die 102. In one embodiment, the multi-functional molecules included in the die attach material 108 are bis-amino molecules. In another embodiment, the multi-functional molecules included in the die attach material 108 comprise 1,6-diamino-hexane. In yet another embodiment, the multi-functional molecules included in the die attach material 108 are bis-epoxy molecules. In one case, the bis-epoxy molecules comprise 1,6-hexanediol diglycidyl ether.

In an embodiment, the first functional group of the molecules of the die attach material 108 is an amino group and the second functional group is an epoxy group. For example, the molecules can be 1-amino-6-hexaneol gylcidyl ether molecules. In another embodiment, the first functional group of the molecules is an amino group and the second functional group is silane group. In yet another embodiment, the first functional group of the molecules is an epoxy group and the second functional group is silane group.

The multi-functional molecules of the die attach material 108 have a cumulative percentage by weight (wt %) in a range of 0.1 wt % to 20 wt %. In the case where the die attach material 108 includes electrically conductive fillers such as Ag, Cu, etc., and/or thermally conductive fillers such as silica, alumina, boron nitride, etc., the multi-functional molecules of the die attach material 108 can have a cumulative percentage by weight of 2 wt % or less. In the case where the die attach material 108 is devoid of electrically and thermally conductive additives, the multi-functional molecules of the die attach material 108 can have a cumulative percentage by weight of 20 wt % or less, e.g. 10 wt % or less.

Figure 3:
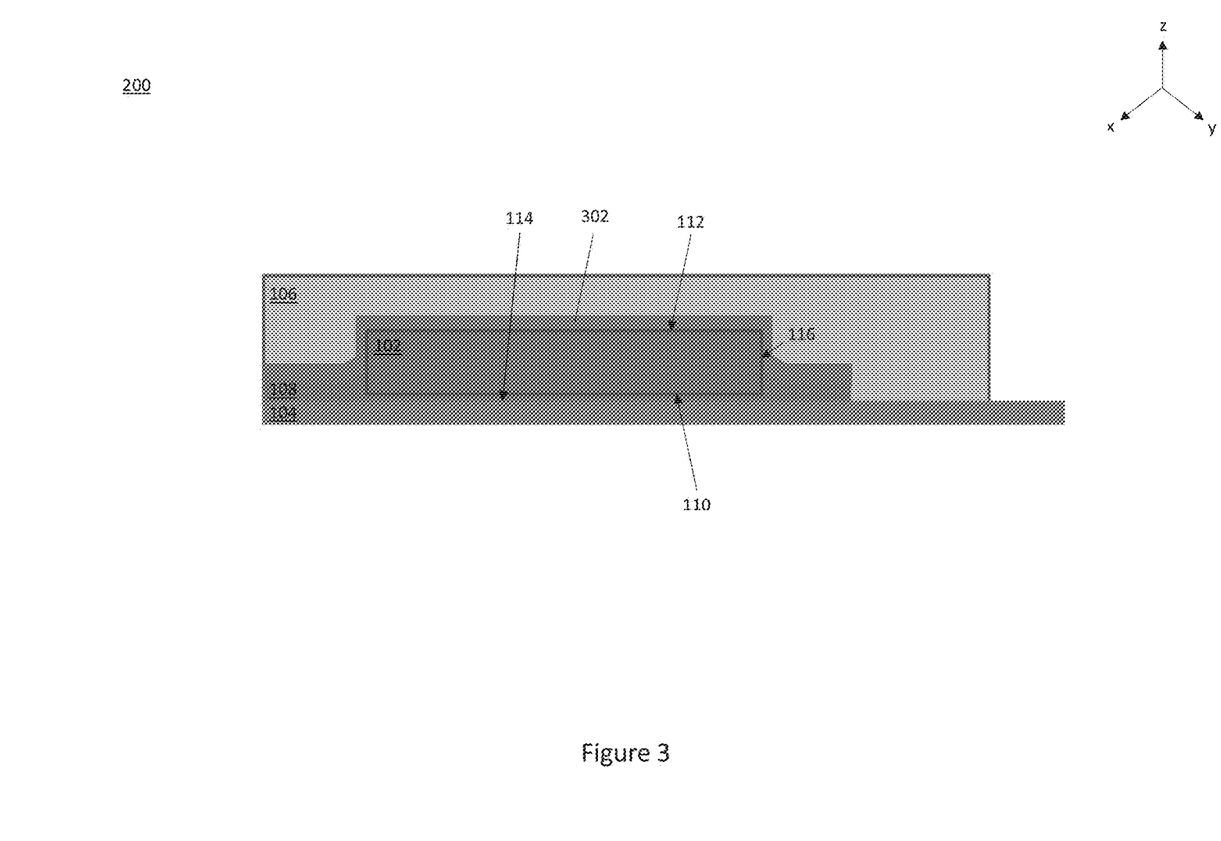
FIG. 3 illustrates a partial sectional view of another embodiment of a semiconductor package with a multi-functional die attach material.

FIG. 3 illustrates a partial sectional view of a semiconductor package 200 according to another embodiment. The semiconductor package embodiment shown in FIG. 3 is similar to the embodiment shown in FIGS. 1 and 2. Different, however, the semiconductor package 200 in FIG. 3 further includes a coating 302 applied to the semiconductor die 102 and contacting the encapsulant 106. The electrical connections 113 between the substrate 104 and the die 102 are out-of-view in FIG. 3, but could also be coated by the coating 302 depending on when the coating 302 is applied. The coating 302 comprises the same multi-functional molecules as the die attach material 108 so as to promote adhesion with the encapsulant 106 around the semiconductor die 102. That is, the coating 302 comprises molecules having a first functional group with at least one free electron pair and a second functional group chemically reacted or reactable with the encapsulant 106 in a way that promotes adhesion with the encapsulant 106 around the semiconductor die 102. The coating 302 can be applied e.g. by spray coating, dip coating, lamination, chemical vapour deposition, liquid deposition etc. to the whole structure after the die attach process or after the electrical connections 113 are formed to the top side 112 of the semiconductor die 102. The coating 302 provides improved and reliable adhesion of the encapsulant 106 and all coated interfaces. Any of the multi-functional molecule/group types described above in connection with the die attach material 108 can be included in the coating 302.

Figure 4A:
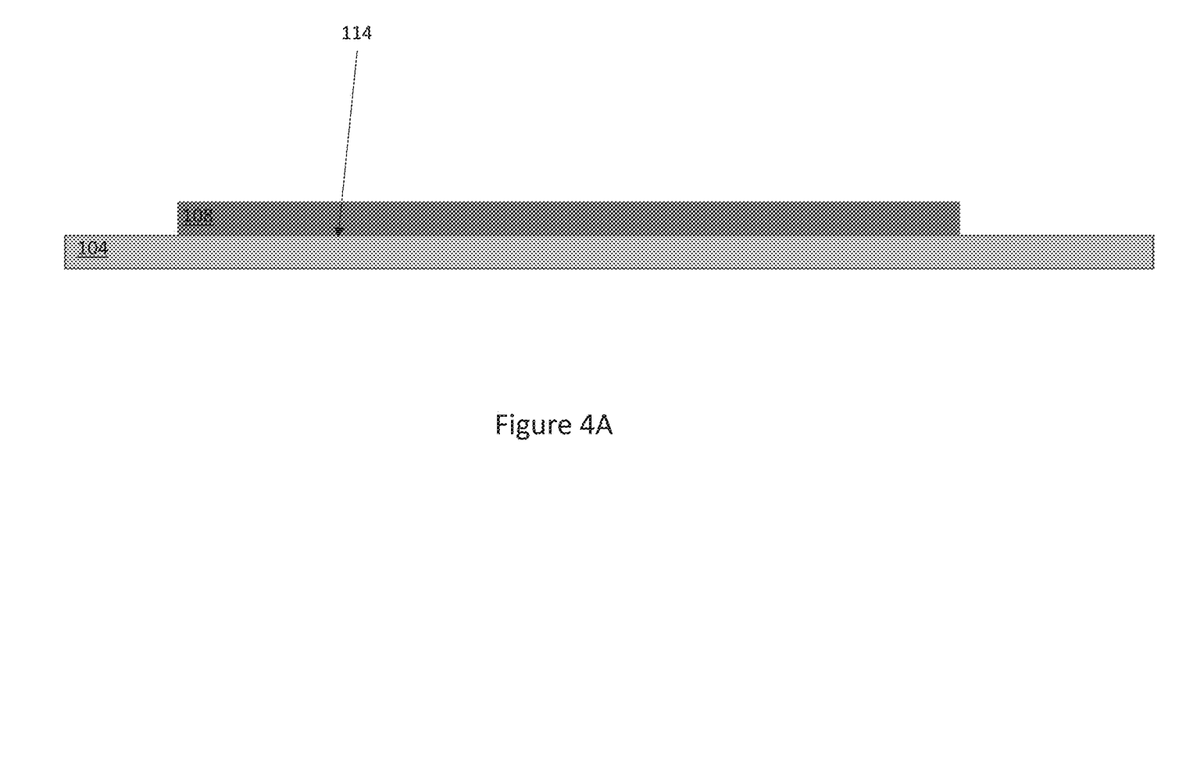
FIGS. 4A through 4C illustrate an embodiment of a method of manufacturing the semiconductor packages shown in FIGS. 1 through 3.
Figure 4B:
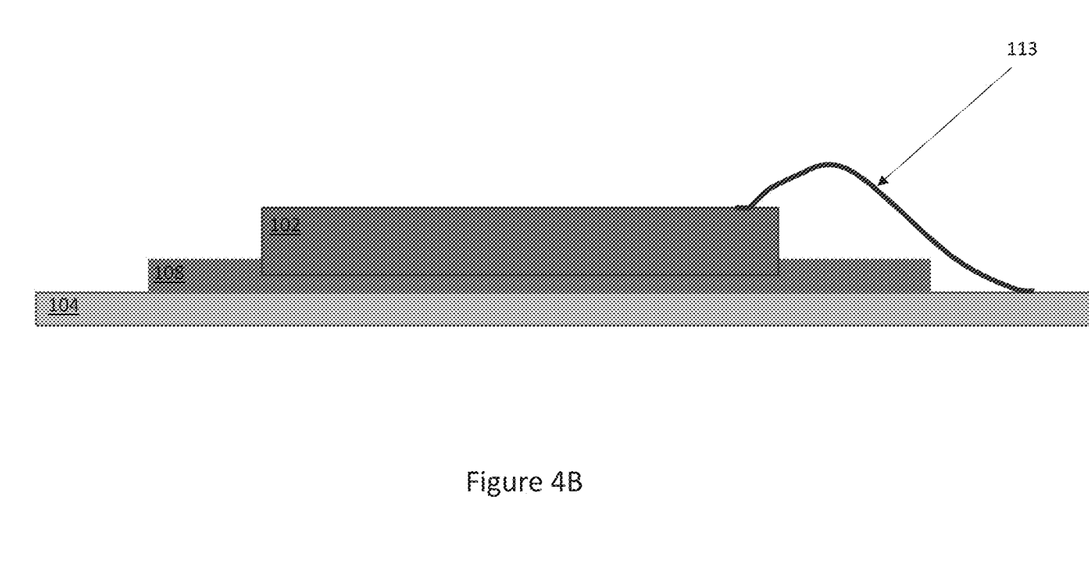
Figure 4C:
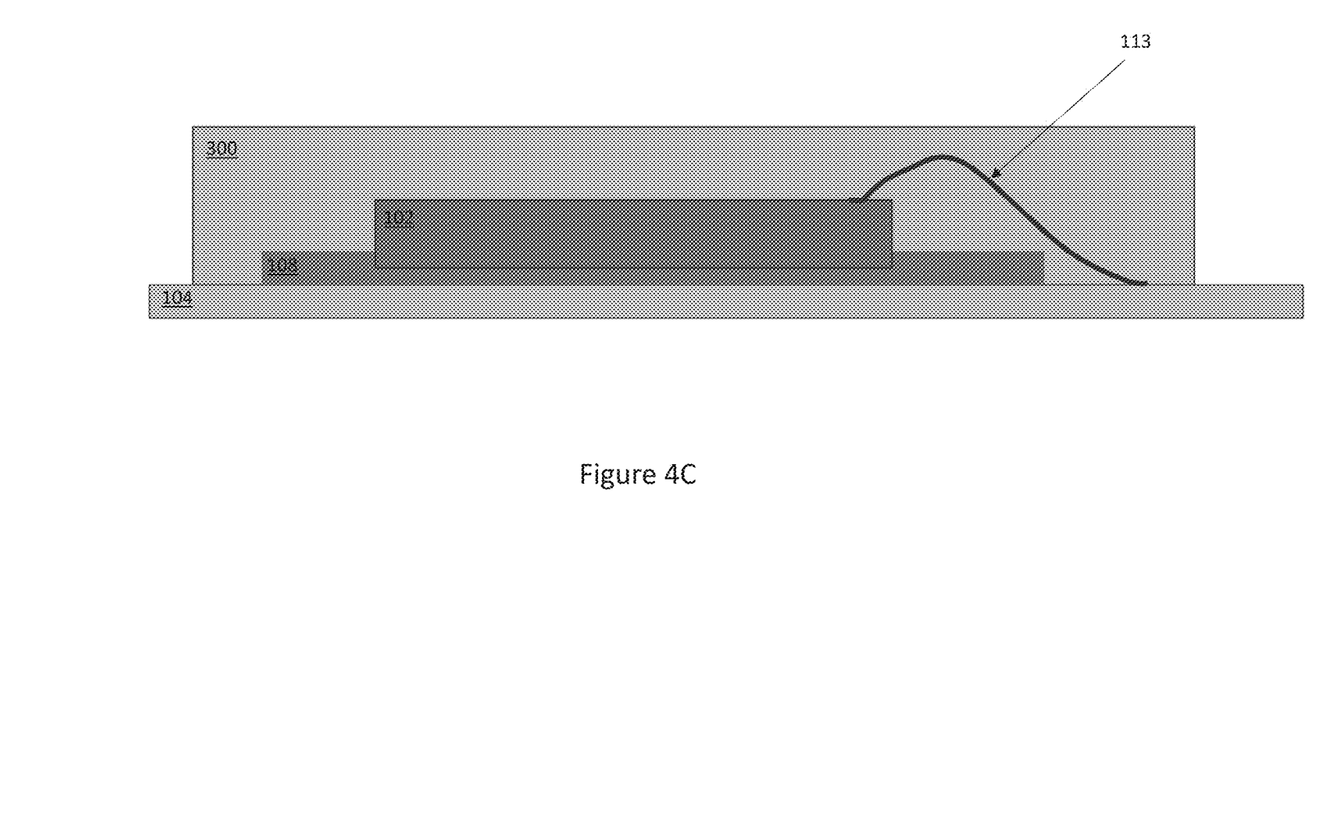

FIGS. 4A through 4C illustrate an embodiment of a method of manufacturing the semiconductor packages 100, 200 shown in FIGS. 1 through 3.

In FIG. 4A, a die attach material 108 is applied to a substrate 104. The substrate 104 is of the kind described above in connection with FIGS. 1 through 3. The die attach material 108 comprises multi-functional molecules of the type also described above in connection with FIGS. 1 through 3. That is, the molecules have a first functional group with at least one free electron pair and a second functional group which promotes adhesion to an encapsulant to be applied later. In one embodiment, the die attach material 108 is a solder paste applied to a die attach surface 114 of the substrate 104, the solder paste comprising multi-functional molecules of the type explained above. In another embodiment, the die attach material 108 is a sinter paste applied to the die attach surface 114 of the substrate 104, the sinter paste comprising multi-functional molecules of the type explained above. In yet another embodiment, the die attach material 108 is a laminate film applied to the die attach surface 114 of the substrate 104, the laminate film comprising multi-functional molecules of the type explained above. In still another embodiment, the die attach material 108 is an adhesive applied to the die attach surface 114 of the substrate 104, the adhesive comprising multi-functional molecules of the type explained above.

In FIG. 4B, a semiconductor die 102 is placed on the die attach material 108 and electrical connections such as, but not limited to, bond wires, metal clips, metal ribbons, etc. are formed between the substrate 104 and one or more electrodes at the top side 112 of the semiconductor die 102. The semiconductor die 102 is of the kind described above in connection with FIGS. 1 through 3. More than one semiconductor die can be attached to the substrate 104 via the die attach material 108 according to this method. One semiconductor die 102 is shown for ease of illustration.

In FIG. 4C, the semiconductor die 102 and at least part of the substrate 104 are covered with an encapsulating material 300. The encapsulating material 300 is the starting material used to form the encapsulant 106 described above in connection with FIGS. 1 through 3. For example, in the case of mold compound or other type of epoxy-based encapsulating material, the encapsulating material 300 can include an epoxy and a precursor such as unreacted epoxy functional groups as a hardener.

The substrate 104 with the semiconductor die 102 and the encapsulating material 300 is then processed at an elevated temperature, to cure the encapsulating material 300, solidify the die attach material 108 and chemically react the second functional group of at least some of the multi-functional molecules of the die attach material 108 with the precursor of the encapsulating material 300 in a way that promotes adhesion with the encapsulating material 300 as the encapsulating material cures. In one embodiment, the elevated processing temperature is in a range of 125° C. to 300° C., e.g. 150° C. to 200° C. The multi-functional molecules included of the die attach material 108 have good and stable affinity to metal surfaces, and a high reactivity to the encapsulating material 300. Accordingly, the second group of the multi-functional molecules bleed-out and act as an adhesion promoter between a metallized die attach surface 114 of the substrate 104 and the encapsulating material 300 as the encapsulating material 300 cures.

The method illustrated in FIGS. 4A through 4C can be modified to manufacture the semiconductor package 200 shown in FIG. 3 by applying a coating to the semiconductor die 102 and the substrate 104 before covering the semiconductor die 102 with the encapsulating material 300. The coating comprises the same multi-functional molecules as the die attach material 108, as explained above in connection with FIG. 3. This way, the second functional group of at least some of the molecules of the coating chemically react with the precursor of the encapsulating material 300 during the elevated temperature processing in a way that promotes adhesion with the encapsulating material 300 as the encapsulating material 300 cures.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
   a semiconductor die;
   a substrate for supporting the semiconductor die;
   an encapsulant covering the semiconductor die and at least part of the substrate; and
   a die attach material attaching the semiconductor die to the substrate, the die attach material comprising molecules having a first functional group with at least one free electron pair and a second functional group chemically reacted or reactable with the encapsulant in a way that promotes adhesion with the encapsulant.

2. The semiconductor package of claim 1, wherein the semiconductor die has a thickness in a range of 20 micrometers to 300 micrometers, and wherein the die attach material does not extend onto a main surface of the semiconductor die facing away from the substrate.

3. The semiconductor package of claim 1, wherein the semiconductor die has a thickness in a range of 50 micrometers to 150 micrometers, and wherein the die attach material does not extend onto a main surface of the semiconductor die facing away from the substrate.

4. The semiconductor package of claim 1, wherein the molecules are bis-amino molecules.

5. The semiconductor package of claim 4, wherein the bis-amino molecules comprise 1,6-diamino-hexane.

6. The semiconductor package of claim 1, wherein the molecules are bis-epoxy molecules.

7. The semiconductor package of claim 6, wherein the bis-epoxy molecules comprise 1,6-hexanediol diglycidyl ether.

8. The semiconductor package of claim 1, wherein the first functional group of the molecules is an epoxy group.

9. The semiconductor package of claim 1, wherein the first functional group of the molecules is an amine group.

10. The semiconductor package of claim 1, wherein the first functional group of the molecules is an amino acid group.

11. The semiconductor package of claim 1, wherein the first functional group of the molecules is a silane group.

12. The semiconductor package of claim 1, wherein the first functional group of the molecules is a sulfur group.

13. The semiconductor package of claim 1, wherein the second functional group of the molecules is an epoxy group.

14. The semiconductor package of claim 1, wherein the second functional group of the molecules is a glycidyl ether group.

15. The semiconductor package of claim 1, wherein the second functional group of the molecules is a silane group.

16. The semiconductor package of claim 1, wherein the first functional group of the molecules is an amino group and the second functional group is an epoxy group.

17. The semiconductor package of claim 16, wherein the molecules are 1-amino-6-hexaneol gylcidyl ether molecules.

18. The semiconductor package of claim 1, wherein the first functional group of the molecules is an amino group and the second functional group is silane group.

19. The semiconductor package of claim 1, wherein the first functional group of the molecules is an epoxy group and the second functional group is silane group.

20. The semiconductor package of claim 1, wherein the molecules have a cumulative percentage by weight in a range of 0.1 wt % to 20 wt %.

21. The semiconductor package of claim 1, wherein the die attach material comprises electrically and/or thermally conductive additives, and wherein the molecules have a cumulative percentage by weight of 2 wt % or less.

22. The semiconductor package of claim 1, wherein the die attach material is devoid of electrically and thermally conductive additives, and wherein the molecules have a cumulative percentage by weight of 10 wt % or less.

23. The semiconductor package of claim 1, further comprising a coating applied to the semiconductor die and contacting the encapsulant, wherein the coating comprises the same molecules as the die attach material in a way that promotes adhesion with the encapsulant.

24. The semiconductor package of claim 1, wherein the semiconductor die is a power transistor die.

25. The semiconductor package of claim 1, wherein the semiconductor die is a logic die, a sensor die, a memory die, a passive die, or power transistor die or a power diode die.

* * * * *